(12) United States Patent
Leobandung et al.

(10) Patent No.: US 9,412,840 B1
(45) Date of Patent: Aug. 9, 2016

(54) SACRIFICIAL LAYER FOR REPLACEMENT METAL SEMICONDUCTOR ALLOY CONTACT FORMATION

(71) Applicant: INTERNATIONAL BUSINESS MACHINES CORPORATION, Armonk, NY (US)

(72) Inventors: Effendi Leobandung, Stormville, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/705,496

(22) Filed: May 6, 2015

(51) Int. Cl.
| | |
|---|---|
| *H01L 29/66* | (2006.01) |
| *H01L 21/768* | (2006.01) |
| *H01L 21/306* | (2006.01) |

(52) U.S. Cl.
CPC .... *H01L 29/66545* (2013.01); *H01L 21/30604* (2013.01); *H01L 21/76897* (2013.01)

(58) Field of Classification Search
CPC ............ H01L 21/76814; H01L 21/764; H01L 21/76843; H01L 21/76802; H01L 21/7682; H01L 21/76877; H01L 21/76855
See application file for complete search history.

(56) References Cited

U.S. PATENT DOCUMENTS

| | | |
|---|---|---|
| 5,525,536 A | 6/1996 | Ueda |
| 6,169,017 B1 | 1/2001 | Lee |
| 6,807,213 B1 | 10/2004 | Shimoyama et al. |
| 7,023,055 B2 | 4/2006 | Ieong et al. |
| 7,329,923 B2 | 2/2008 | Doris et al. |
| 7,524,757 B2 | 4/2009 | Kim et al. |
| 8,039,388 B1 | 10/2011 | Ng et al. |
| 8,171,626 B1 | 5/2012 | Yu et al. |
| 2003/0082910 A1 | 5/2003 | Walsh |
| 2005/0116290 A1 | 6/2005 | de Souza et al. |
| 2013/0313647 A1* | 11/2013 | Aquilino ......... H01L 21/823807 257/368 |

FOREIGN PATENT DOCUMENTS

JP          6163454 A     6/1994

* cited by examiner

*Primary Examiner* — Kyoung Lee
(74) *Attorney, Agent, or Firm* — Scully, Scott, Murphy & Presser, P.C.; Louis J. Percello, Esq.

(57) ABSTRACT

A sacrificial layer is formed on exposed surfaces of source/drain structures that are located at the footprint of a gate stack. A stack of, from bottom to top, a middle-of-the-line (MOL) liner, a MOL dielectric material, and an optional dielectric cap material layer is then formed surrounding the gate stack. A contact opening is then formed that exposes a portion of the sacrificial layer. The entirety of the sacrificial layer is then removed and replaced with a metal semiconductor alloy. A conductive metal structure is then provided in the remaining volume of the contact opening.

20 Claims, 12 Drawing Sheets

SACRIFICIAL LAYER FOR REPLACEMENT METAL SEMICONDUCTOR ALLOY CONTACT FORMATION

BACKGROUND

The present application relates to a method of forming a semiconductor structure and, more particularly, to a method of forming source/drain metal semiconductor alloy contacts that have increased contact area.

Field effect transistors (FETs) are the basic building block of today's integrated circuits. Such transistors can be formed in conventional bulk substrates (such as silicon) or in semiconductor-on-insulator (SOI) substrates. State of the art FETs can be fabricated utilizing a gate-first process or a gate-last process. In a gate-first process, a gate material stack is first formed, followed by the formation of source/drain regions. In a gate-last process, the source/drain regions are formed prior to replacing a sacrificial gate structure with a functional gate structure.

State of the art FETs can be fabricated by depositing a gate conductor over a gate dielectric and a semiconductor substrate. Generally, the FET fabrication process implements lithography and etching processes to define the gate structures. After providing the gate structures, source/drain extensions are formed into a portion of the semiconductor substrate and on both sides of each gate structure by ion implantation. Sometimes this implant is performed using a spacer to create a specific distance between the gate structure and the implanted junction. In some instances, such as in the manufacture of an n-FET device, the source/drain extensions for the n-FET device are implanted with no spacer. For a p-FET device, the source/drain extensions are typically implanted with a spacer present. A thicker spacer is typically formed after the source/drain extensions have been implanted. In some instances, deep source/drain implants can be performed with the thick spacer present. In other instances, and for advanced technologies, the source region and the drain region can be formed using a selective epitaxial growth process. High temperature anneals can be performed to activate the junctions after which the source/drain and top portion of the gate are generally converted into a metal semiconductor alloy (i.e., a metal silicide). The formation of the metal semiconductor alloy typically requires that a transition metal be deposited on the semiconductor substrate followed by a process to produce the metal semiconductor alloy. Such a process forms metal semiconductor alloy contacts to the deep source/drain regions.

In current technologies and for tightly spaced devices, the contact area for metal semiconductor alloy formation above the source/drain regions is extremely limited. As such, there is a need for providing a method in which source/drain metal semiconductor alloy contacts can be formed that overcomes the drawbacks associated with conventional processes.

SUMMARY

A sacrificial layer is formed on exposed surfaces of source/drain structures that are located at the footprint of a gate stack. A stack of, from bottom to top, a middle-of-the-line (MOL) liner, a MOL dielectric material, and an optional dielectric cap material layer is then formed surrounding the gate stack. A contact opening is then formed that exposes a portion of the sacrificial layer. The entirety of the sacrificial layer is the removed and replaced with a metal semiconductor alloy. A conductive metal structure is then provided in the remaining volume of the contact opening.

In one aspect of the present application, a method of forming a semiconductor structure is provided. In one embodiment of the present application, the method includes forming a gate stack in a device region of a semiconductor substrate, wherein a source/drain structure is provided at least within a portion of the semiconductor substrate and at a footprint of the gate stack. A sacrificial layer is formed on an exposed surface of each of the source/drain structures. A material stack of, from bottom to top, a middle-of-the-line (MOL) liner and a MOL dielectric material, is then provided surrounding the gate stack. A contact opening is formed through a portion of the material stack that exposes a portion of the sacrificial layer present on the exposed surface of each of the source/drain structures. Next, an entirety of the sacrificial layer is replaced with a metal semiconductor alloy contact, wherein the metal semiconductor alloy contact is present on the exposed surface of each of the source/drain structures.

In another embodiment, the method includes forming a first gate stack in a first device region and a second gate stack in a second device region of a semiconductor substrate, wherein a source/drain structure is provided at least within a portion of the semiconductor substrate and at a footprint of the first gate stack and the second gate stack. Next, a sacrificial layer is formed on an exposed surface of each of the source/drain structures. A material stack of, from bottom to top, a middle-of-the-line (MOL) liner and a MOL dielectric material is provided surrounding the first gate stack and the second gate stack. Next, a contact opening is formed through a portion of the material stack to expose a portion of the sacrificial layer present on the exposed surface of each of the source/drain structures. An entirety of the sacrificial layer within the first device region is then replaced with a first metal semiconductor alloy contact, wherein the first metal semiconductor alloy contact is present on the exposed surface of each of the source/drain structures within the first device region. Also, an entirety of the sacrificial layer within the second device region is replaced with a second metal semiconductor alloy contact, wherein the second metal semiconductor alloy contact is present on the exposed surface of each of the source/drain structures within the second device region, and wherein the replacing of the entirety of the sacrificial layer within the first device region with the first semiconductor alloy contact, and the replacing of the entirety of the sacrificial layer within the second device region are performed simultaneously or one after the other.

DETAILED DESCRIPTION

Figure 1:
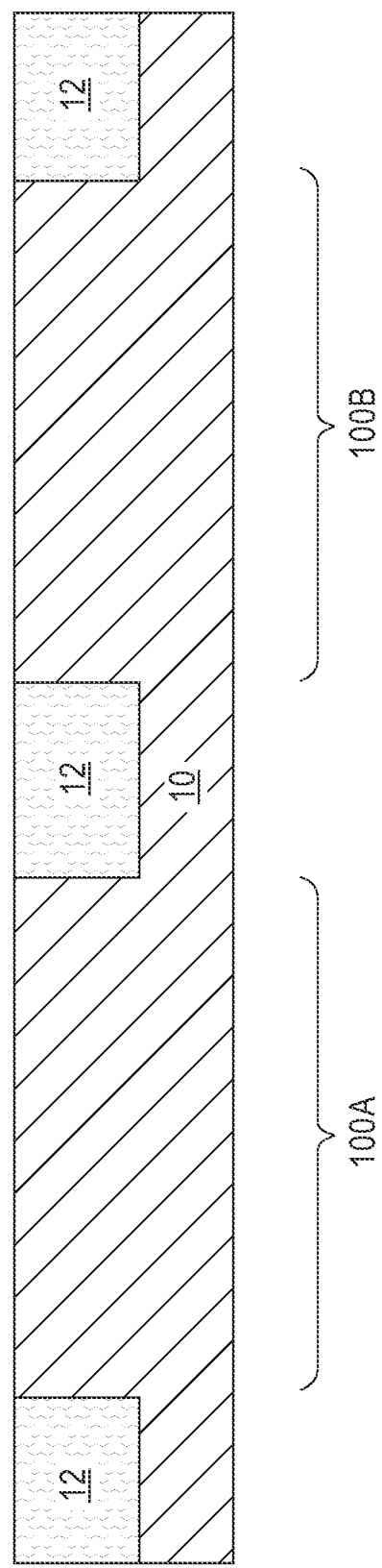
FIG. 1 is a cross sectional view of an exemplary semiconductor structure including a semiconductor substrate containing a first device region and a second device region that are separated by an isolation structure that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure including a semiconductor substrate 10 containing a first device region 100A and a second device region 100B that are separated by an isolation structure 12 that can be employed in accordance with an embodiment of the present application. Although the present application describes and illustrates the presence of a first device region and a second device region, the present application can be employed in instances in which a single device region or multiple device regions are formed.

In some embodiments of the present application, the semiconductor substrate 10 can be a bulk semiconductor substrate. When a bulk semiconductor substrate is employed as semiconductor substrate 10, the bulk semiconductor substrate can be comprised of any semiconductor material including, but not limited to, Si, Ge, SiGe, SiC, SiGeC, II/IV, and III/V compound semiconductors such as, for example, InAs, GaAs, and InP. Multilayers of these semiconductor materials can also be used as the semiconductor material of the bulk semiconductor. In one embodiment, the semiconductor substrate 10 can be comprised of a single crystalline semiconductor material, such as, for example, single crystalline silicon. In other embodiments, the semiconductor substrate 10 may comprise a polycrystalline or amorphous semiconductor material.

In another embodiment, a semiconductor-on-insulator (SOI) substrate (not specifically shown) can be employed as the semiconductor substrate 10. Although not specifically shown, one skilled in the art understands that an SOI substrate includes a handle substrate, a buried insulator layer located on an upper surface of the handle substrate, and a semiconductor layer located on an uppermost surface of the buried insulator layer. The handle substrate provides mechanical support for the buried insulator layer and the semiconductor layer.

The handle substrate and the semiconductor layer of the SOI substrate may comprise the same, or different, semiconductor material. The term "semiconductor" as used herein in connection with the semiconductor material of the handle substrate and the semiconductor layer denotes any semiconductor material including, for example, Si, Ge, SiGe, SiC, SiGeC, II/VI, and III/V compound semiconductors such as, for example, InAs, GaAs, or InP. Multilayers of these semiconductor materials can also be used as the semiconductor material of the handle substrate and the semiconductor layer. In one embodiment, the handle substrate and the semiconductor layer are both comprised of silicon. In some embodiments, the handle substrate is a non-semiconductor material including, for example, a dielectric material and/or a conductive material. In yet other embodiments, the handle substrate can be omitted and a substrate including an insulator layer and a semiconductor layer can be used as semiconductor substrate 10.

In some embodiments, the handle substrate and the semiconductor layer may have the same or different crystal orientation. For example, the crystal orientation of the handle substrate and/or the semiconductor layer may be {100}, {110}, or {111}. Other crystallographic orientations besides those specifically mentioned can also be used in the present application. The handle substrate and/or the semiconductor layer of the SOI substrate may be a single crystalline semiconductor material, a polycrystalline material, or an amorphous material. Typically, at least the semiconductor layer is a single crystalline semiconductor material. In some embodiments, the semiconductor layer that is located atop the buried insulator layer can be processed to include semiconductor regions having different crystal orientations.

The buried insulator layer of the SOI substrate may be a crystalline or non-crystalline oxide or nitride. In one embodiment, the buried insulator layer is an oxide such as, for example, silicon dioxide. The buried insulator layer may be continuous or it may be discontinuous. When a discontinuous buried insulator region is present, the insulator region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

In one example, the thickness of the semiconductor layer of the SOI substrate can be from 10 nm to 100 nm. In another example, the thickness of the semiconductor layer of the SOI substrate can be from 50 nm to 70 nm. In some embodiments, and when an ETSOI (extremely thin semiconductor-on-insulator) substrate is employed, the semiconductor layer of the SOI has a thickness of less than 10 nm. If the thickness of the semiconductor layer is not within one of the above mentioned ranges, a thinning step such as, for example, planarization or etching can be used to reduce the thickness of the semiconductor layer to a value within one of the ranges mentioned above. The buried insulator layer of the SOI substrate may have a thickness from 1 nm to 200 nm. Other thicknesses that are lesser than, or greater than, the aforementioned thickness range can also be employed as the buried insulator layer. The thickness of the handle substrate of the SOI substrate is inconsequential to the present application.

In some other embodiments, hybrid semiconductor substrates which have different surface regions of different crystallographic orientations can be employed as semiconductor substrate 10. When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

Semiconductor substrate 10 may be doped, undoped or contain doped and undoped regions therein. For clarity, the doped regions are not specifically shown in the drawings of the present application. Each doped region within the semiconductor material of the semiconductor substrate 10 may have the same, or they may have different conductivities and/or doping concentrations. The doped regions that are present in the semiconductor material of semiconductor substrate 10 are typically referred to as well regions and they are formed utilizing a conventional ion implantation process, gas phase doping or epitaxial growth.

In some embodiments, the semiconductor substrate 10 can be processed to include at least one isolation structure 12 present at least partially in the semiconductor substrate 10. The at least one isolation structure 12 can be a trench isolation structure (as shown) or a field oxide isolation structure (not shown). The trench isolation structure can be formed utilizing a conventional trench isolation process well known to those skilled in the art. For example, lithography, etching and filling of the trench with a trench dielectric such as an oxide may be used in forming the trench isolation region. Optionally, a liner may be formed in the trench prior to trench fill, a densification step may be performed after the trench fill and a planarization process may follow the trench fill as well. The field oxide isolation structure may be formed utilizing a so-called local oxidation of silicon process.

The isolation structure 12 that is formed may provide isolation between neighboring gate structures, typically required when the neighboring gate structures have opposite conductivities, i.e., n-type transistors and p-type transistors. As such and in some embodiments of the present application, the isolation structure 12 can separate a first device region (i.e., first device region 100A) in which a first-conductivity type transistor can be formed and a second device region (i.e., second device region 100B) in which a second conductivity type transistor, which differs from the first conductivity type transistor can be formed. In one example, the first device region 100A is a region in which an n-type field effect transistor can be formed, while the second device region 100B is a region in which a p-type field effect transistor can be formed. In another example, the first device region 100A is a region in which a p-type field effect transistor can be formed, while the second device region 100B is a region in which an n-type field effect transistor can be formed. In some embodiments, the first and second device regions 100A, 100B can contain the same conductivity type transistors.

Although the present application describes and illustrates a semiconductor substrate 10 that is processed to be used in forming planar semiconductor devices, the semiconductor substrate 10 described and illustrated can be processed to include semiconductor fins and/or semiconductor nanowires utilizing techniques well known to those skilled in the art. For example, semiconductor fins can be formed by patterning semiconductor substrate 10 by a sidewall image transfer process or by lithography and etching. Semiconductor nanowires can be formed by patterning the semiconductor substrate to include semiconductor nanowires attached to semiconductor pad regions and thereafter, and in some embodiments, material present beneath each semiconductor nanowire can be removed to provide suspended semiconductor nanowires. When semiconductor fins and semiconductor nanowires are formed, the processing flow described below can be generally applied to those structures.

Figure 2:
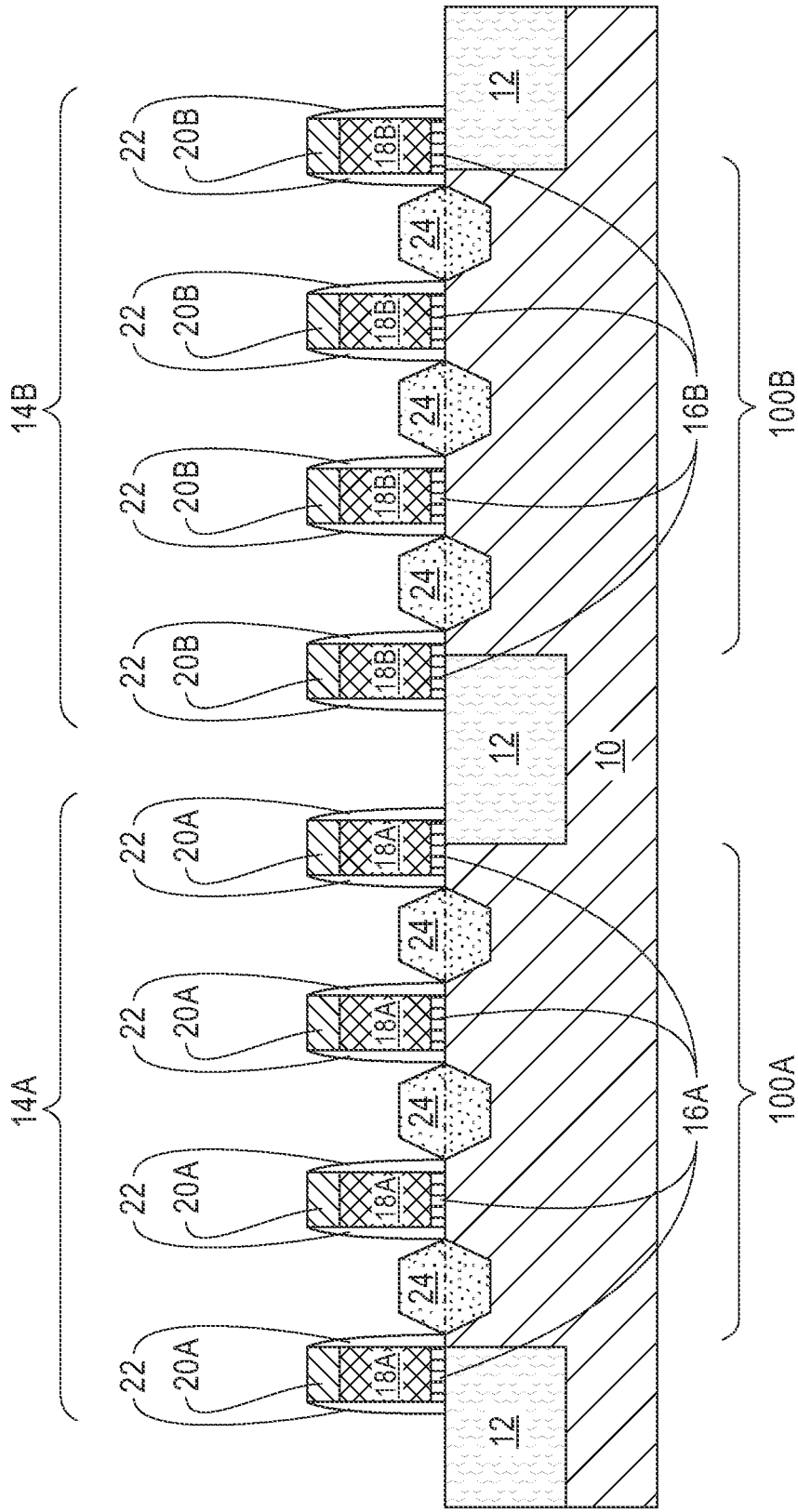
FIG. 2 is a cross sectional view of the exemplary semiconductor structure of FIG. 1 after forming first gate stacks within the first device region and second gate stacks within the second device region, gate spacers, and source/drain structures.

Referring now to FIG. 2, there is illustrated the exemplary semiconductor structure of FIG. 1 after forming first gate stacks 14A within the first device region 100A and second gate stacks 14B within the second device region 100B, gate spacers 22, and source/drain structures 24. As is shown, some of the first and second gate stacks 14A, 14B may be partially located over an isolation structure 12, while others of the first and second gate stacks 14A, 14B are formed entirely over the semiconductor substrate 10. In some embodiments, the first and second gate stacks 14A, 14B that are formed partially on the isolation regions 12 can be omitted.

In some embodiments of the present application, and as shown, the first and second gate stacks are gate stacks of a functional gate structure. By "functional gate structure" it is meant a permanent gate structure used to control output current (i.e., flow of carriers in the channel) of a semiconducting device through electrical or magnetic fields. In such an embodiment, each gate stack 14A, 14B includes, from bottom to top, a gate dielectric portion 16A, 16B and a gate conductor portion 18A, 18B. In some embodiments, each gate stack 14A, 14B also includes a hard mask cap portion 20A, 20B.

The gate dielectric portion 16A, 16B comprises a gate dielectric material. The gate dielectric material that provides the gate dielectric portion 16A, 16B can be an oxide, nitride, and/or oxynitride. In one example, the gate dielectric material that provides the gate dielectric portion 16A, 16B can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric portion 16A, 16B.

The gate dielectric material used in providing the gate dielectric portion 16A, 16B can be formed by any deposition process including, for example, chemical vapor deposition (CVD), plasma enhanced chemical vapor deposition (PECVD), physical vapor deposition (PVD), sputtering, or atomic layer deposition. In some embodiments and when multiple functional gate structures are formed, each gate dielectric portion 16A, 16B comprises a same gate dielectric material. In other embodiments, gate dielectric portions 16A may comprise a first gate dielectric material, while gate dielectric portions 16B may comprise a second gate dielectric material that differs in composition from the first gate dielectric material. When a different gate dielectric material is used for the gate dielectric portions 16A, 16B, block mask technology can be used. In one embodiment of the present application, the gate dielectric material used in providing the gate dielectric portion 16A, 16B can have a thickness in a range from 1 nm to 10 nm. Other thicknesses that are lesser than, or greater than, the aforementioned thickness range can also be employed for the gate dielectric material.

The gate conductor portion 18A, 18B comprises a gate conductor material. The gate conductor material used in providing the gate conductor portion 18A, 18B can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion 18A may comprise an nFET gate metal, while the conductor portion 18B may comprise a pFET gate metal.

The gate conductor material used in providing the gate conductor portion 18A, 18B can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions 18A, 18B, block mask technology can be used. In one embodiment, the gate conductor material used in providing the gate conductor portion 18A, 18B has a thickness from 1 nm to 100 nm. Other thicknesses that are lesser than, or greater than, the aforementioned thickness range can also be employed for the gate conductor material used in providing the gate conductor portion 18A, 18B.

If present, the gate cap portion 20A, 20B comprises a gate cap material. The gate cap material that provides each gate cap portion 20A, 20B may include an oxide, nitride and/or oxynitride. In one embodiment, each gate cap portion 20A, 20B comprises silicon dioxide, silicon nitride, and/or silicon oxynitride. The dielectric material that provides each gate cap portion 20A, 20B can be formed utilizing a conventional deposition process such as, for example, chemical vapor deposition or plasma enhanced chemical vapor deposition. The dielectric material that provides each gate cap portion 20A, 20B can have a thickness from 5 nm to 20 nm. Other thicknesses that are lesser than, or greater than, the aforementioned thickness range can also be employed as the thickness of the dielectric material that provides each gate cap portion.

Each functional gate structure can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

In other embodiments of the present application, the first and second gate structures 14A, 14B are sacrificial gate structures. By sacrificial gate structure" it is meant a material or material stack that serves as a placeholder for a subsequently formed functional gate structure. In such a process, the functional gate structure is formed after the source/drain structures have been formed. In one embodiment of the present application, the sacrificial gate structures can be replaced after forming the MOL dielectric material. When sacrificial gate structures are employed, the gate dielectric portion of the replacement functional gate structure may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portion 16A, 16B. The sacrificial gate material portion includes one of the gate conductor materials mentioned above for gate conductor portion 18A, 18B. The sacrificial gate cap portion includes one of the gate cap material mentioned above for gate cap portions 20A, 20B. The sacrificial gate structures can be formed by deposition of the various material layers and then patterning the resultant sacrificial material sack by utilizing, for example, lithography and etching.

In some embodiments of the present application, the first gate stacks 14A can be functional gate stacks, while the second gate stacks are sacrificial gate stacks. In another embodiment, the first gate stacks 14A can be sacrificial gate stacks, while the second gate stacks 14B are functional gate stacks.

Each gate spacer 22 can be formed by first providing a spacer material and then etching the spacer material. Each gate spacer 22 can be formed on exposed sidewalls of each first gate stack 14A and each second gate stack 14B. The spacer material may be composed of any dielectric spacer material including, for example, a dielectric oxide, dielectric nitride, and/or dielectric oxynitride. In one example, the spacer material used in providing the gate spacer 22 may be composed of silicon dioxide or silicon nitride. The spacer material can be provided by a deposition process including, for example, chemical vapor deposition (CVD), plasma enhanced chemical vapor deposition (PECVD), or physical vapor deposition (PVD). The etching of the spacer material may comprise a dry etch process such as, for example, a reactive ion etch.

FIG. 2 also shows the presence of source/drain structures 24. In the illustrated embodiment, some of the first and second gate structures 14A, 14B share a common source/drain structure 24. In some embodiments, the source/drain structures 24 may comprise source/drain diffusion regions that are located entirely beneath the topmost surface of the semiconductor substrate 10. In the drawings, the area beneath the dotted line would represent a portion of the source/drain diffusion regions. As is known to those skilled in the art, a portion of the source/drain diffusion regions (not shown) would be located beneath the gate spacer 22 and be in direct physical contact with the device channel region that would be located directly beneath each gate stack 14A, 14B. In some embodiments, the source/drain regions 24 may also include a raised source/drain region. In the drawings, the area above the dotted line would represent a raised source/drain region.

The source/drain diffusion regions contain a p-type or n-type dopant. The dopant that provides the source/drain diffusion regions may be introduced into the semiconductor substrate 10 by ion implantation. The term "p-type" refers to the addition of impurities to an intrinsic semiconductor that creates deficiencies of valence electrons. In a silicon-containing substrate, examples of p-type dopants, i.e., impurities, include, but are not limited to, boron, aluminum, gallium and indium. "N-type" refers to the addition of impurities that contributes free electrons to an intrinsic semiconductor. In a silicon containing substrate, examples of n-type dopants, i.e., impurities, include, but are not limited to, antimony, arsenic and phosphorous. The concentration of dopants within the source/drain diffusion regions can be within ranges typically used in forming metal oxide semiconductor field effect transistors (MOSFETs).

The raised source/drain regions can be formed by epitaxially growing a semiconductor material atop the source/drain diffusion regions. The raised source/drain regions may have a faceted (i.e., non-planar) topmost surface (as shown), or a planar topmost surface (not shown). The semiconductor material that provides the raised source/drain regions may be the same as, or different from, the topmost semiconductor material of the semiconductor substrate 10. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth processes that are suitable for use in forming the raised source/drain regions of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) or molecular beam epitaxy (MBE). The temperature for epitaxial deposition process typically ranges from 550° C. to 900° C. Although higher temperature typically results in faster deposition, the faster deposition may result in crystal defects and film cracking.

A number of different sources may be used for the deposition of the raised source/drain regions of the source/drain structures 24. In some embodiments, the gas source for the deposition of epitaxial semiconductor material includes a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In some embodiments, n-type dopants or p-type dopants as mentioned above can be introduced into the gas source that provides the raised source/drain regions. In other embodiments, an intrinsic semiconductor material is epitaxially grown, and then n-type dopants or p-types dopants can be introduced by ion implantation or gas phase doping.

In some embodiments, the source/drain structures 24 may be of unitary construction and can be formed by forming a trench within the semiconductor substrate 10 and then utilizing an epitaxial growth process to fill the trench with a doped or undoped semiconductor material. In some embodiments, the epitaxial growth process may overfill the trench to provide a raised source/drain portion of a source/drain structure. In either embodiment, doping can be performed during the epitaxial growth process, or after the epitaxial growth process.

Figure 3:
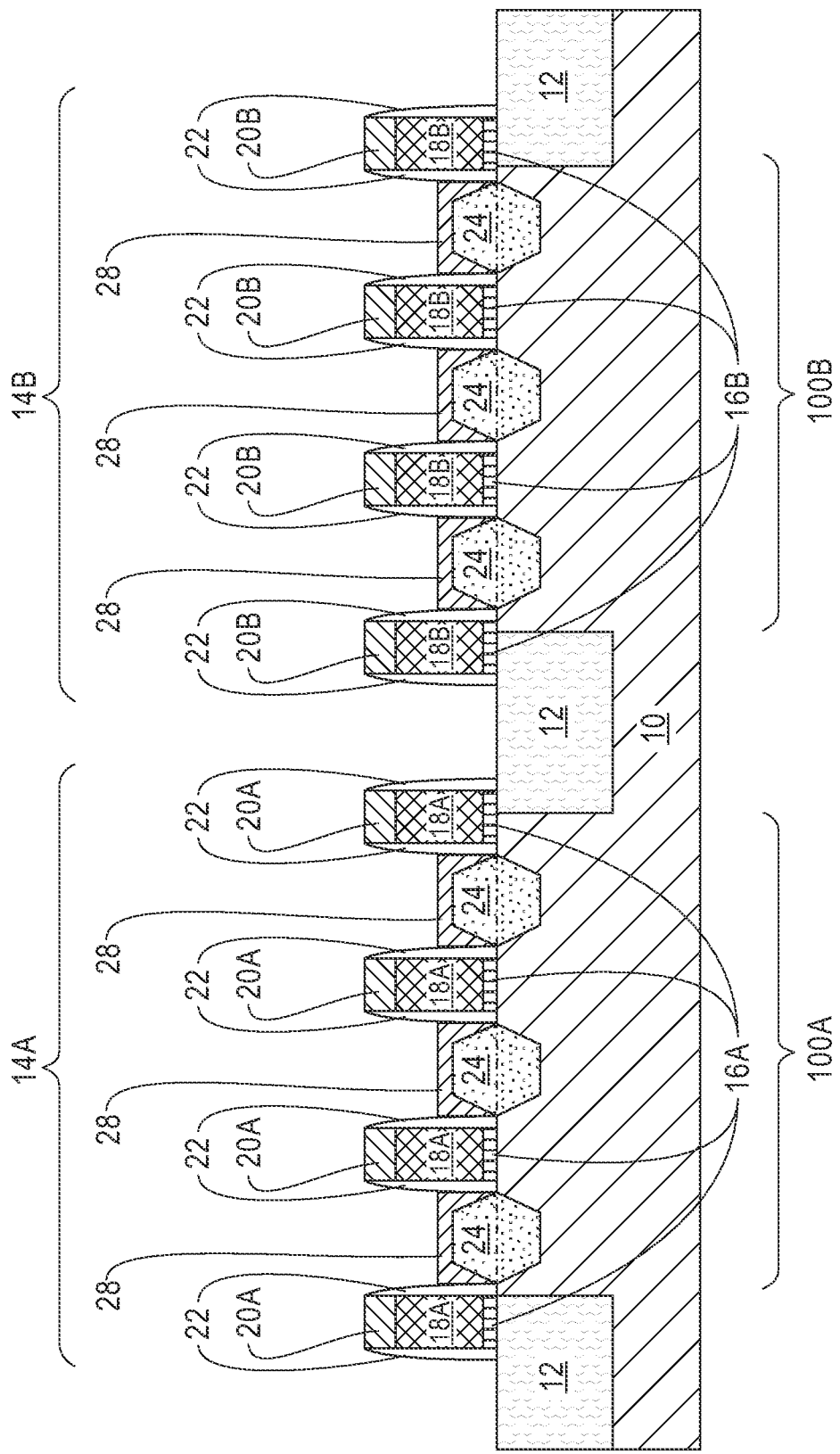
FIG. 3 is a cross sectional view of the exemplary semiconductor structure of FIG. 2 after forming a sacrificial layer over each source/drain structure.

Referring now to FIG. 3, there is illustrated the exemplary semiconductor structure of FIG. 2 after forming a sacrificial layer 28 over each source/drain structure 24. As is shown, the sacrificial layer 28 covers an entirety of the exposed topmost surface of each source/drain structure 24. A sidewall edge of each sacrificial layer 28 may directly contact an outer sidewall surface of a gate spacer 22. Also, the topmost surface of each sacrificial layer 28 is located beneath a topmost surface of each gate stack 14A, 14B.

The sacrificial layer 28 may comprise any material (e.g., semiconductor, or dielectric) that can be selectively formed only over each source/drain structure 24. Examples of materials that can be used for the sacrificial layer 28 include, but are not limited to, Ge, semiconductor oxides, AlAs, or GaP. In one embodiment, the material that provides the sacrificial layer 28 may be formed by a selective deposition process such as, for example, an epitaxial growth process. In another embodiment, the sacrificial layer 28 layer can be deposited, planarized and recessed appropriately. The material that provides the sacrificial layer 28 can have a thickness from 5 nm to 20 nm. Other thicknesses that are lesser than, or greater than, the aforementioned thickness range can also be employed as the thickness of the material that provides each sacrificial layer 28.

Figure 4:
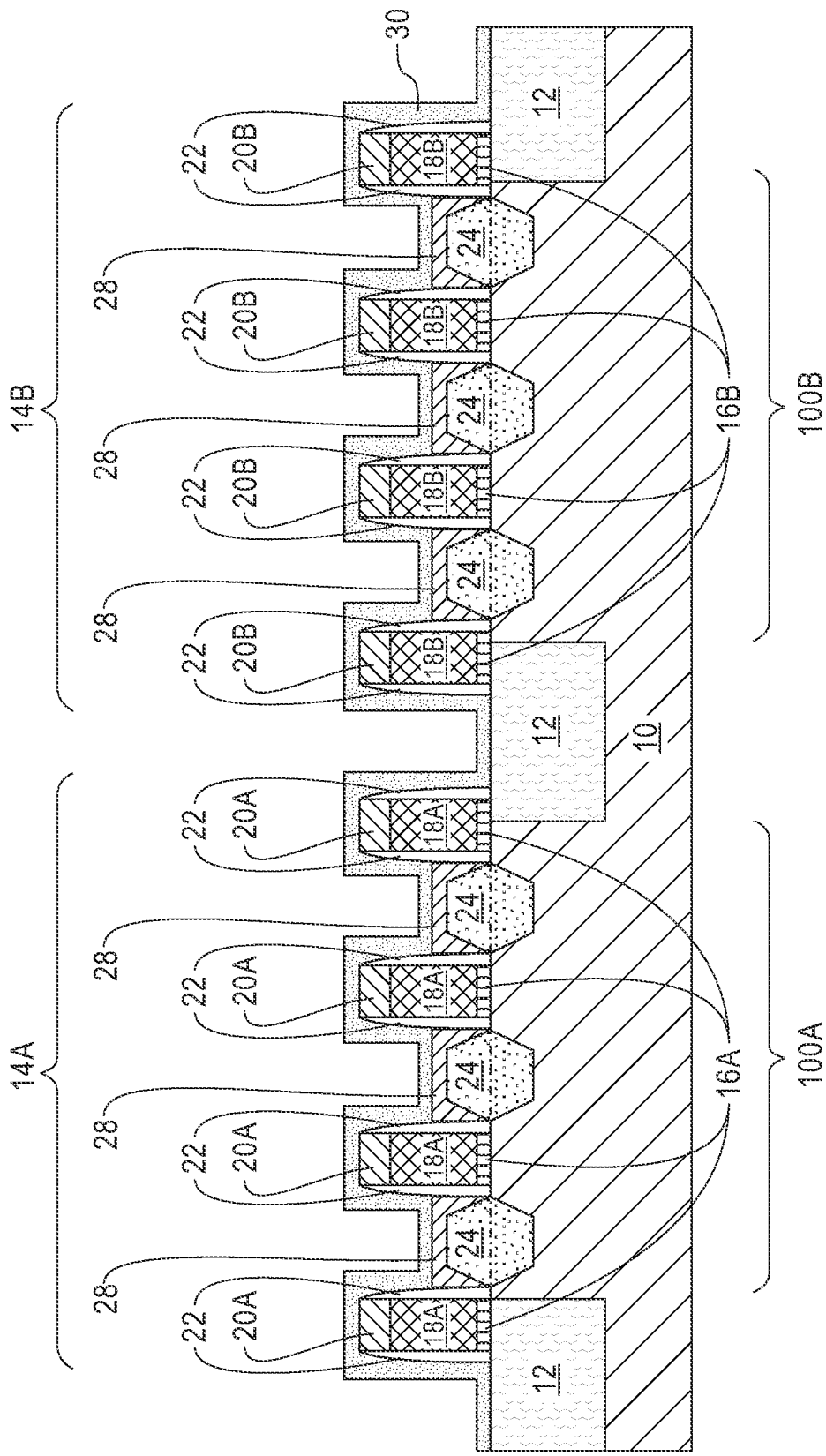
FIG. 4 is a cross sectional view of the exemplary semiconductor structure of FIG. 3 after forming a middle-of-the-line (MOL) liner.

Referring now to FIG. 4, there is illustrated the exemplary semiconductor structure of FIG. 3 after forming a middle-of-the-line (MOL) liner 30 on all exposed surfaces. The MOL liner 30 may comprise any dielectric liner material such as, for example, silicon nitride, silicon dioxide and/or silicon oxynitride. In one embodiment, silicon nitride is used as the material of the MOL liner 30. The MOL liner 30 can be formed utilizing a deposition process such as, for example, chemical vapor deposition, plasma enhanced chemical vapor deposition or physical vapor deposition. The thickness of the MOL liner 30 can be from 1 nm to 30 nm. Other thicknesses that are lesser than, or greater than, the aforementioned thickness range may also be used as the thickness of the MOL liner 30.

Figure 5:
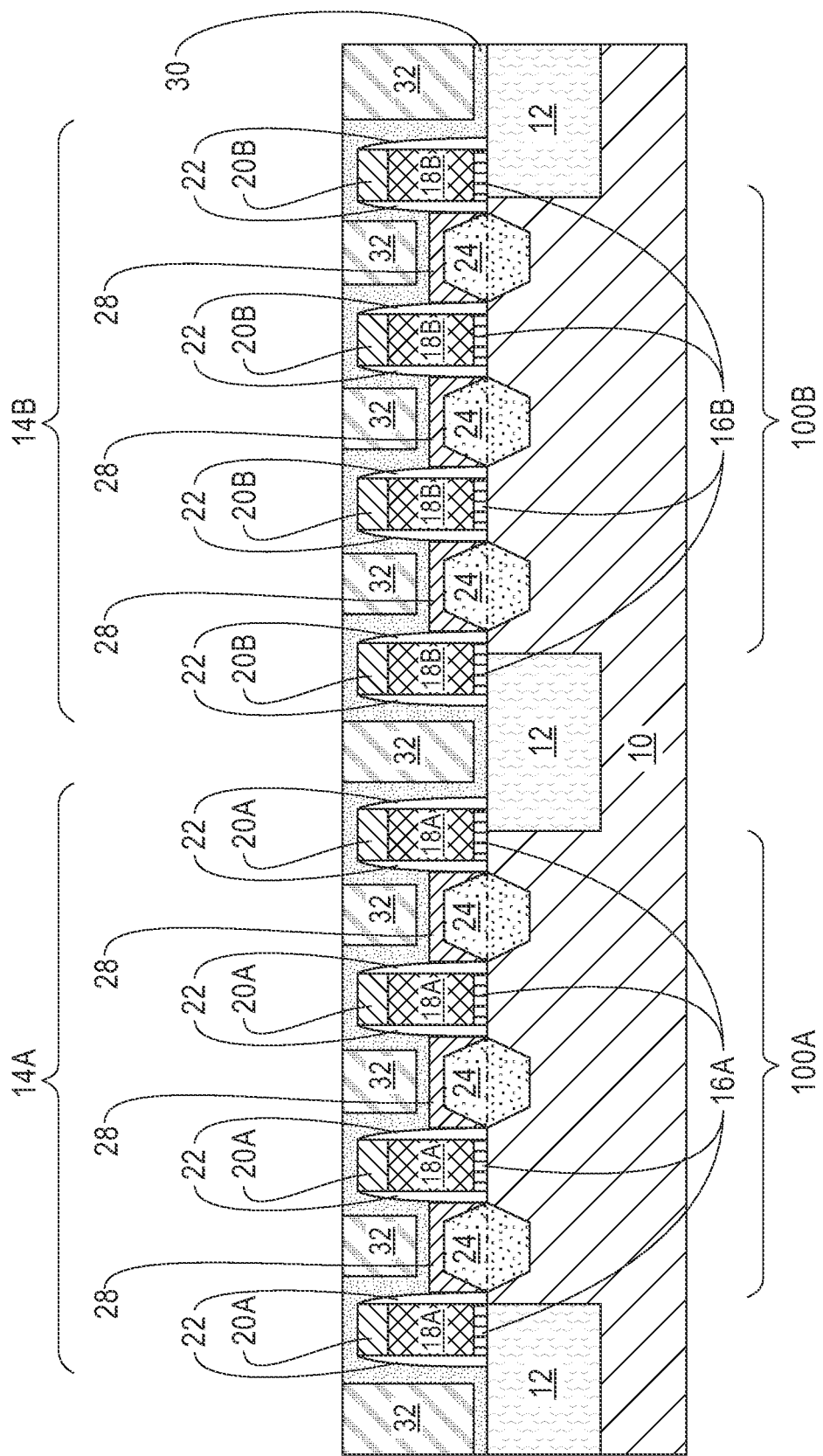
FIG. 5 is a cross sectional view of the exemplary semiconductor structure of FIG. 4 after forming a MOL dielectric material.

Referring now to FIG. 5, there is illustrated the exemplary semiconductor structure of FIG. 4 after forming a MOL dielectric material 32. As is shown, the MOL liner 32 has a topmost surface that is coplanar with a topmost surface of the MOL dielectric material 30 that is present atop each gate stack 14A, 14B. The MOL dielectric material 32 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the MOL dielectric material 32. The use of a self-planarizing dielectric material as MOL dielectric material 32 may avoid the need to perform a subsequent planarizing step.

In one embodiment, the MOL dielectric material 32 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the MOL dielectric material 32, a planarization process or an etch back process follows the deposition of the MOL dielectric material 32. The thickness of the MOL dielectric material 32 that can be employed in the present application may vary depending on the type of dielectric material employed as well as the method that was employed in forming the same. In one embodiment, the MOL dielectric material 32 has a thickness from 80 nm to 500 nm. Other thicknesses that are greater or lesser than the range provided above can also be used for the MOL dielectric material 32.

In some embodiments of the present application (not shown) and after MOL dielectric material 32 formation, each sacrificial gate stack may now be replaced with a functional gate stack as defined above. In such an embodiment, the MOL liner 30 located atop each sacrificial gate stack and the underlying sacrificial gate stack are removed and replaced with a functional gate stack that may or may not include a dielectric cap. In either instance, a topmost surface of each functional gate stack would be coplanar with a topmost surface of the MOL dielectric material 32. In such an embodiment, a U-shaped gate dielectric portion can be formed as described above.

Figure 6:
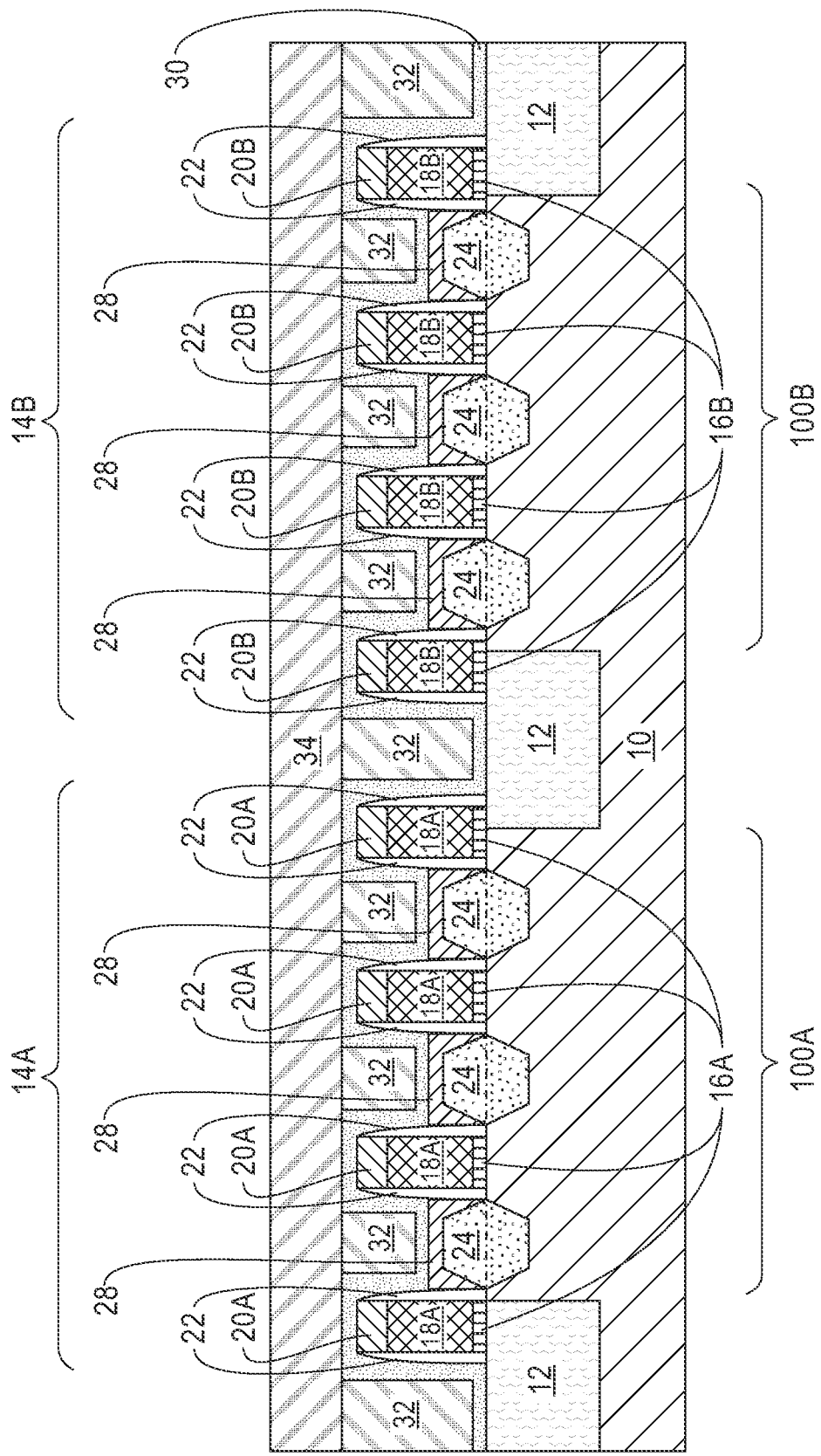
FIG. 6 is a cross sectional view of the exemplary semiconductor structure of FIG. 5 after forming a dielectric cap material layer atop the MOL dielectric material.

Referring now to FIG. 6, there is illustrated the exemplary semiconductor structure of FIG. 5 after forming a dielectric cap material layer 34 atop the MOL dielectric material 32. The dielectric cap material layer 34 includes an insulator material that can be different from, or the same as, the MOL dielectric material 32. Examples of insulator materials that can be used as the dielectric cap material layer 34 include, for example, silicon dioxide, silicon nitride and silicon oxynitride. The dielectric cap material layer 34 can be formed by a deposition process including, for example, chemical vapor deposition, plasma enhanced chemical vapor deposition, evaporation and spin-on coating. The dielectric cap material layer 34 has a thickness from 1 nm to 20 nm. Other thicknesses can also be used for the thickness of the dielectric cap material layer 34. In some embodiments, the dielectric material cap layer is optional.

Figure 7:
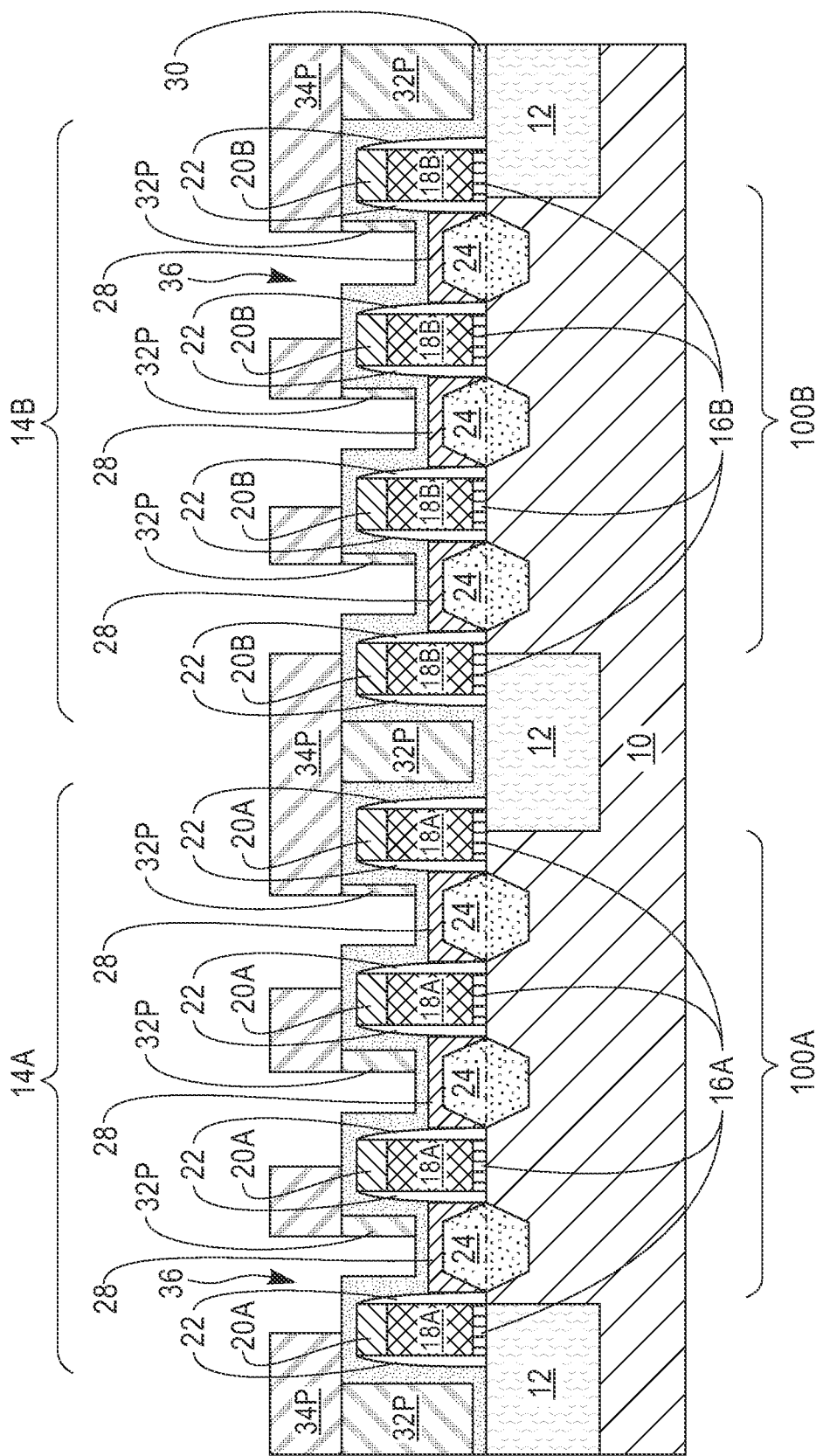
FIG. 7 is a cross sectional view of the exemplary semiconductor structure of FIG. 6 after forming a contact opening in the dielectric cap material layer and the MOL dielectric material that exposes a portion of the MOL liner that is present at least over each source/drain structure in the first and second device regions.

Referring now to FIG. 7, there is illustrated the exemplary semiconductor structure of FIG. 6 after forming a contact opening 36 in the dielectric cap material layer 34 and the MOL dielectric material 32 that exposes a portion of the MOL liner 30 that is at least present on the sacrificial layer 28 over each source/drain structure 24 in both the first and second device regions 100A, 100B. As is shown, each contact opening 36 is formed through the dielectric cap material 34, and the MOL dielectric material 32. Each contact opening 36 stops on at topmost surface of a portion of the MOL liner 30 that is at least present atop the sacrificial layer 28. In some embodiments of the present application and as shown, each contact opening 36 also lands atop each gate structure 14A, 14B and exposes the MOL liner 30 that is present atop each gate stack 14A, 14B. In such an embodiment, each contact opening 36 has an upper width that is greater than a lower width. Each contact opening 36 can be formed by lithography and etching. One or more etching processes can be used in forming each contact opening 36. The portions of the MOL dielectric material 32 that remain after contact opening 36 formation may be referred to herein as MOL dielectric material portions 32P, and the portions of the dielectric cap material layer 34 that remain may be referred to herein as dielectric cap material portions 34P.

Figure 8:
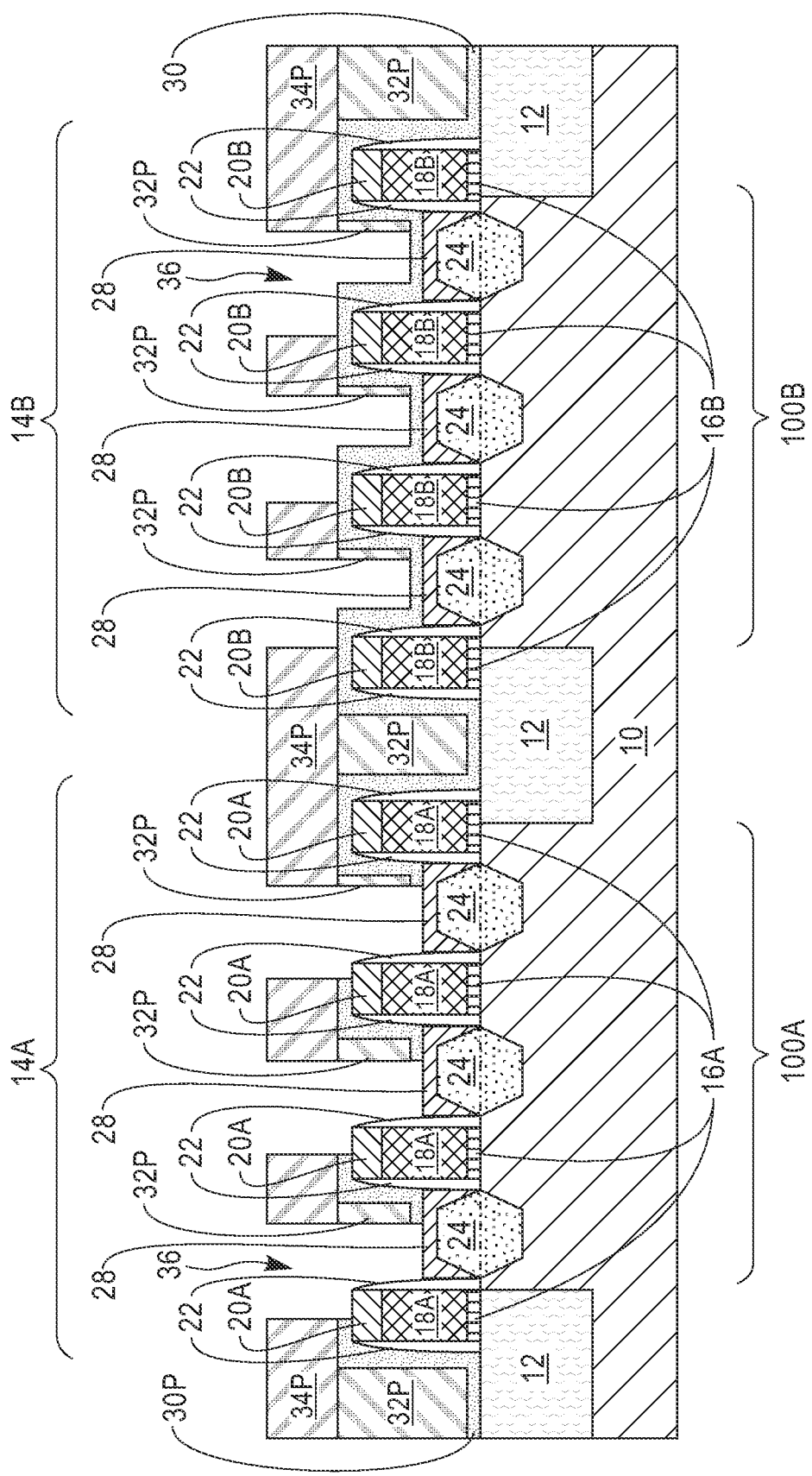
FIG. 8 is a cross sectional view of the exemplary semiconductor structure of FIG. 7 after removing an exposed portion of the MOL liner at the bottom of each contact opening within the first device region to expose a portion of the sacrificial layer.

Referring now to FIG. 8, there is illustrated the exemplary semiconductor structure of FIG. 7 after removing an exposed portion of the MOL liner 30 at the bottom of each contact opening 36 within the first device region 100A to expose a portion of the sacrificial layer 28; this step extends the contact opening 36 in the first device region 100A to a topmost surface of a portion of the sacrificial layer 28. In some embodiments in which a portion of each contact opening 26 lands atop the gate stacks 14A, 14B, this step also removes the exposed portions of MOL liner 30 atop the gate stacks 14A, 14B and along the gate spacer 22. The removal of the exposed portion of the MOL liner 30 that is present at least at the bottom of each contact opening 36 that is present over each source/drain structure 24 within the first device region 100A, may include forming a block mask (not shown) over the second device region 100B and thereafter an etching process that selectively removes the entirety of the exposed sacrificial layer 28 with the first device region 100A is employed. In one example, and when Ge is used as the sacrificial material, a gas phase HCl etch can be used.

The remaining MOL liner that is present in the structure above the source/drain structures 24 may be referred to as MOL liner portion 30P. In some embodiments of the present application, the block mask present over the second device region 100B may now be removed. In yet other embodiments, the block mask present over the second device region 100B may remain in the structure during the processing of the first metal semiconductor alloy contacts (to be subsequently described).

Figure 9:
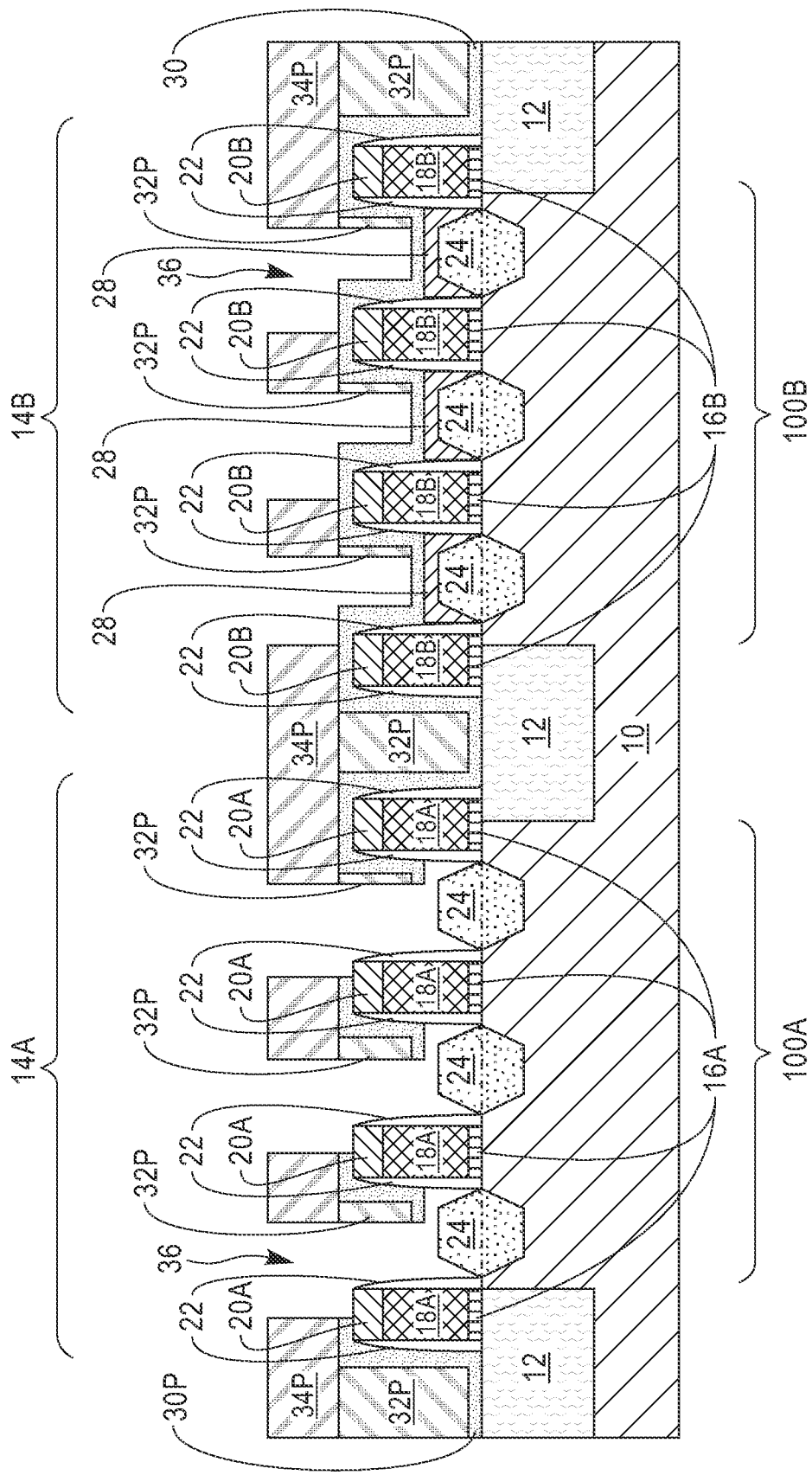
FIG. 9 is a cross sectional view of the exemplary semiconductor structure of FIG. 8 after removing the sacrificial layer that is present over each source/drain structure in the first device region.

Referring now to FIG. 9, there is illustrated the exemplary semiconductor structure of FIG. 8 after removing the sacrificial layer 28 that is present over each source/drain structure 24 within the first device region 100A. The removal of the sacrificial layer 28 that is present over each source/drain structure 24 within the first device region 100A, re-exposes an underlying portion of each source/drain structure 24 within the first device region 100A.

Figure 10:
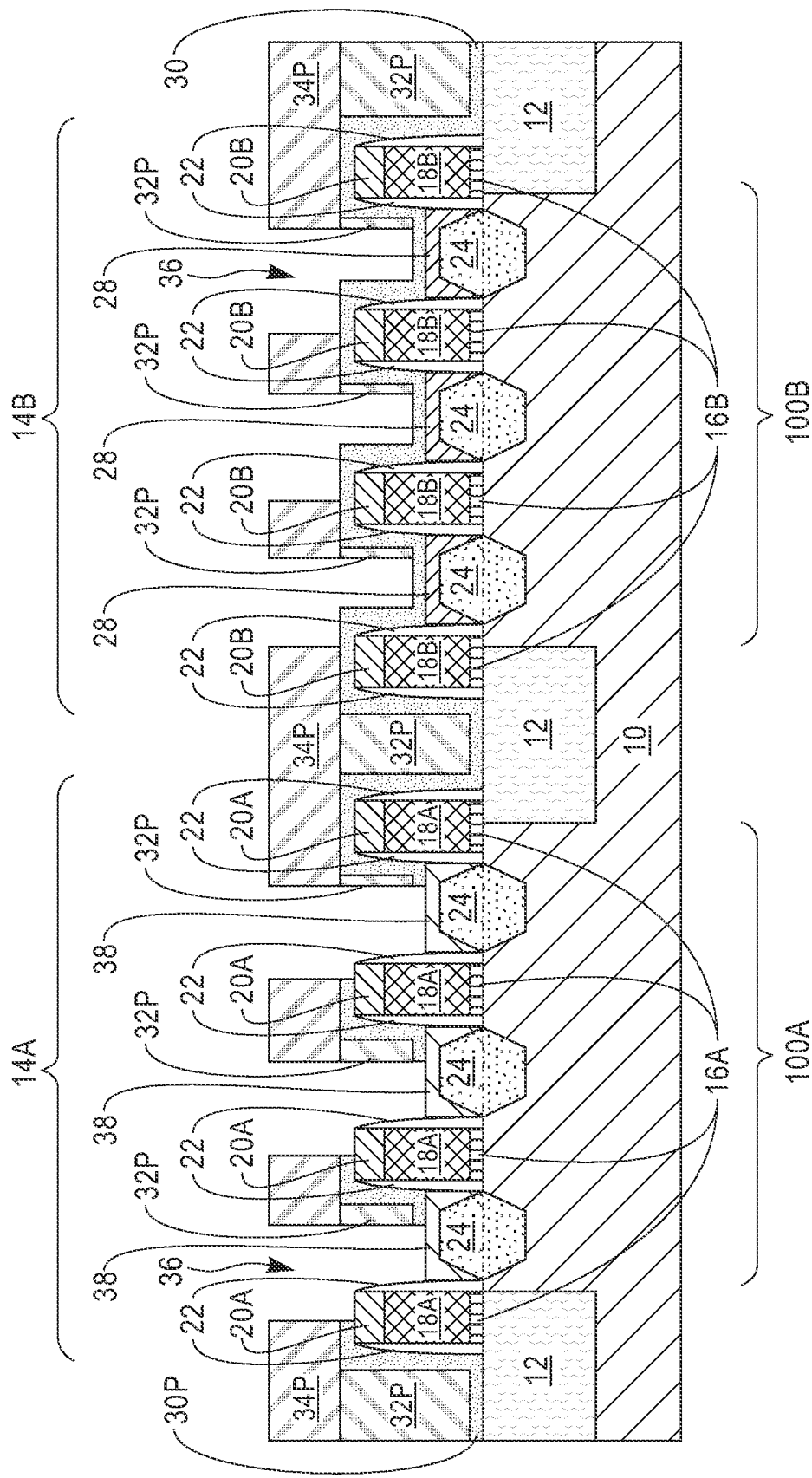
FIG. 10 is a cross sectional view of the exemplary semiconductor structure of FIG. 9 after forming a first metal semiconductor alloy contact over each source/drain structure within the first device region.

Referring now to FIG. 10, there is illustrated the exemplary semiconductor structure of FIG. 9 after forming a first metal semiconductor alloy contact 38 over each source/drain structure 24 within the first device region 100A. The first metal semiconductor alloy contact 38 is formed in the area previously occupied by the sacrificial layer 28. The first metal semiconductor alloy contact 38 thus has a bottom surface that directly contacts the exposed surfaces of the source/drain structures 24 within the first device region 100A, sidewall surfaces that directly contact outer sidewalls of a gate spacer 22, and a portion of the topmost surface of the first metal semiconductor alloy contact 38 that directly contacts a bottommost surface of the remaining portion of the MOL liner (i.e., MOL liner portion 30P).

The first metal semiconductor alloy contact 38 can be formed by first depositing a first metal semiconductor alloy forming metal (not shown) such as for example, Ni, Pt, Co, and alloys such as NiPt, on the structure shown in FIG. 9. In some embodiments, it is preferable to have the deposition to be conformal so it fills the gap left by removing the sacrificial layer 28. An optional first diffusion barrier layer such as, for example, TiN or TaN, can be deposited atop the first metal semiconductor alloy forming metal. An anneal is then performed that causes reaction between the first metal semiconductor alloy forming metal and an underlying portion of the source/drain structures 24 within the first device region 100A which forms the first metal semiconductor alloy contact 38. The anneal may be performed at a temperature from 300° C. to 700° C. Other annealing temperatures that are lesser than, or greater than, the aforementioned temperature range can be employed so long as the selected temperature is capable of forming a metal semiconductor alloy. After annealing, any unreactive first metal semiconductor alloy forming metal and, if present, the first diffusion barrier layer can be removed. When Ni is used the NiSi phase is formed due to its low resistivity. For example, formation temperatures of NiSi may include 400° C.-600° C.

In this embodiment of the present application, each first metal semiconductor alloy contact 38 that is formed includes a metal semiconductor alloy forming metal and a semiconductor material as present within an upper portion of each source/drain structure 24. The thickness of the first metal semiconductor alloy contact 38 may range from 2 nm to 50 nm. Other thicknesses that are lesser than, or greater than, the aforementioned thickness range can also be provided for the first metal semiconductor alloy contact 38.

Figure 11:
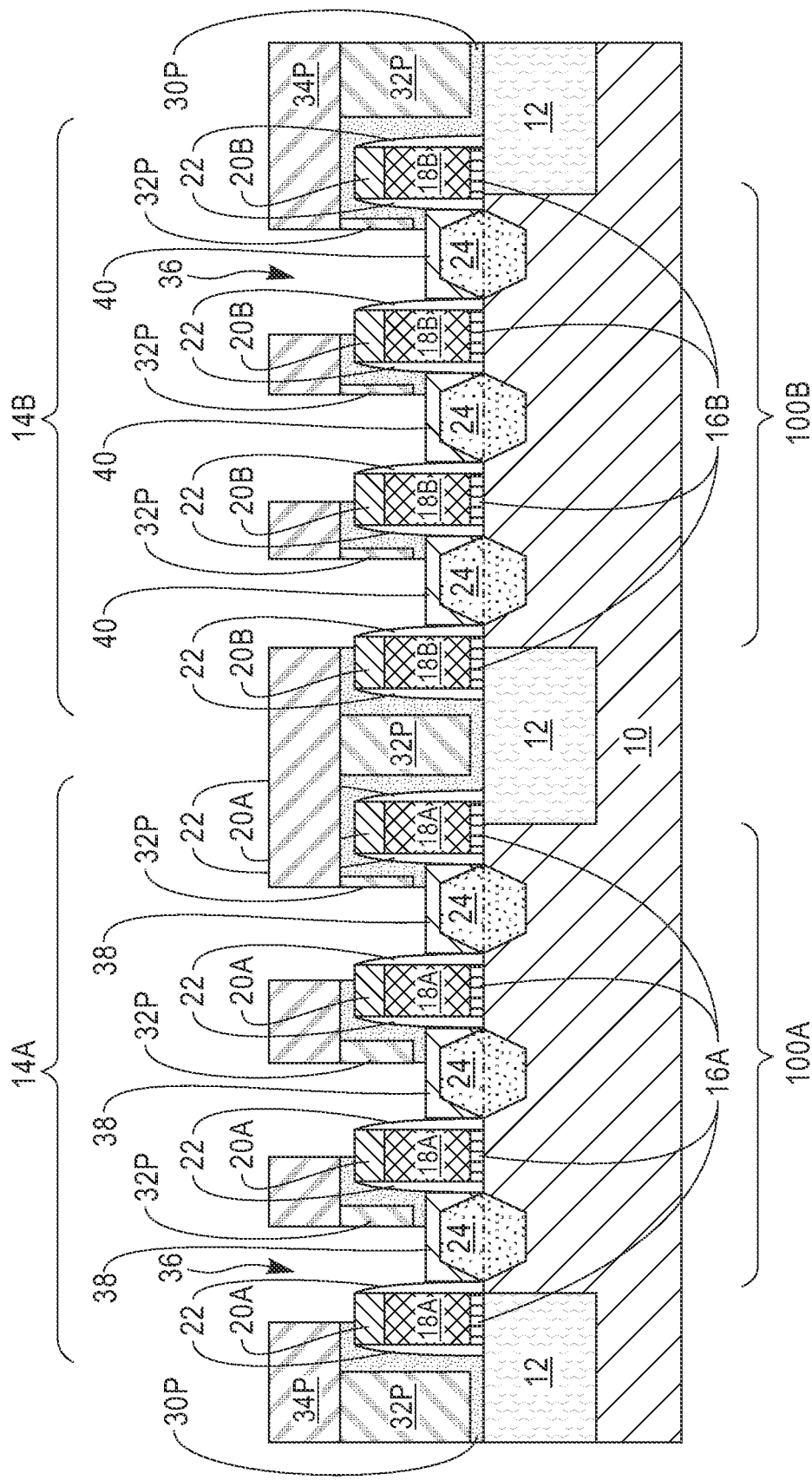
FIG. 11 is a cross sectional view of the exemplary semiconductor structure of FIG. 10 after removing the MOL liner and the sacrificial layer that is present over each source/drain structure in the second device region, and forming a second metal semiconductor alloy contact over each source/drain structure within the second device region.

Referring now to FIG. 11, there is illustrated the exemplary semiconductor structure of FIG. 10 after removing the sacrificial layer 28 that is present over each source/drain structure 24 within the second device region 100B and forming a second metal semiconductor alloy contact 40 over each source/drain structure 24 within the second device region 100B. If the block mask that was formed in the second device region 100B was not previously removed, that block mask can now be removed prior to processing the second device region 100B. In some embodiments, a block mask may be formed over the first device region 100A during the processing of the second device region 100B, and after said processing of the second device region 100B, the block mask may be removed from the first device region 100A.

The removal of the sacrificial layer 28 over the each source/drain structure 24 within the second device region 100B includes first etching an exposed portion of the underlying MOL liner 30; See, for example, the description above for forming the structure shown in FIG. 8. After this etch, another etch is used to remove the entirety of the sacrificial layer 28 from the structure; See, for example, the description above for forming the structure shown in FIG. 9.

The second metal semiconductor alloy contact 40 is formed in the area previously occupied by the sacrificial layer 28. The second metal semiconductor alloy contact 40 thus has a bottom surface that directly contacts the exposed surfaces of the source/drain structures 24 within the second device region 100B, sidewall surfaces that directly contact outer sidewalls of a gate spacer 22, and a portion of the topmost surface of the second metal semiconductor alloy contact 40 that directly contacts a bottommost surface of the remaining portion of the MOL liner (i.e., MOL liner portion 30P).

The second metal semiconductor alloy contact 40 can be formed by first depositing a second metal semiconductor alloy forming metal (not shown) such as for example, Ni, Pt, Co, and alloys such as NiPt, on the structure shown in FIG. 10. In this embodiment, the second metal semiconductor alloy forming metal comprises a different metal than the first metal semiconductor alloy forming metal mentioned above. In some embodiments, it is preferable to have the deposition to be conformal so it fills the gap left by removing the sacrificial layer 28. An optional second diffusion barrier layer such as, for example, TiN or TaN, can be deposited atop the second metal semiconductor alloy forming metal. An anneal is then performed that causes reaction between the second metal semiconductor alloy forming metal and an underlying portion of the source/drain structures 24 within the second device region 100B which forms the second metal semiconductor alloy contact 40. The anneal may be performed at a temperature from 300° C. to 700° C. Other annealing temperatures that are lesser than, or greater, than the aforementioned temperature range can be employed so long as the selected temperature is capable of forming a metal semiconductor alloy. After annealing, any unreactive second metal semiconductor alloy forming metal and, if present, the first diffusion barrier layer can be removed.

In this embodiment of the present application, each second metal semiconductor alloy contact 40 that is formed includes a metal semiconductor alloy forming metal and a semiconductor material as present within an upper portion of each source/drain structure 24. The thickness of the second metal semiconductor alloy contact 40 may range from 2 nm to 50 nm. Other thicknesses that are lesser than, or greater than, the aforementioned thickness range can also be provided for the second metal semiconductor alloy contact 40.

Although the present application describes and illustrates the formation of the second metal semiconductor alloy contact 40 at a later step than forming the first metal semiconductor alloy contact 38, the present application also includes an embodiment in which the first and second metal semiconductor alloy contacts are formed simultaneously, i.e., at the same time. In such an embodiment, the sacrificial layer 28 that is present over each source/drain structure 24 within the first device region 100A and the second device region 100B are removed at the same time, and thereafter first and second metal semiconductor alloy contacts 38, 40 having a same composition are formed as described above in forming, for example, the first metal semiconductor alloy contact 38. In one embodiment of the present application, the second metal semiconductor alloy contact 40 may be processed prior to processing the first metal semiconductor alloy contact 38.

Figure 12:
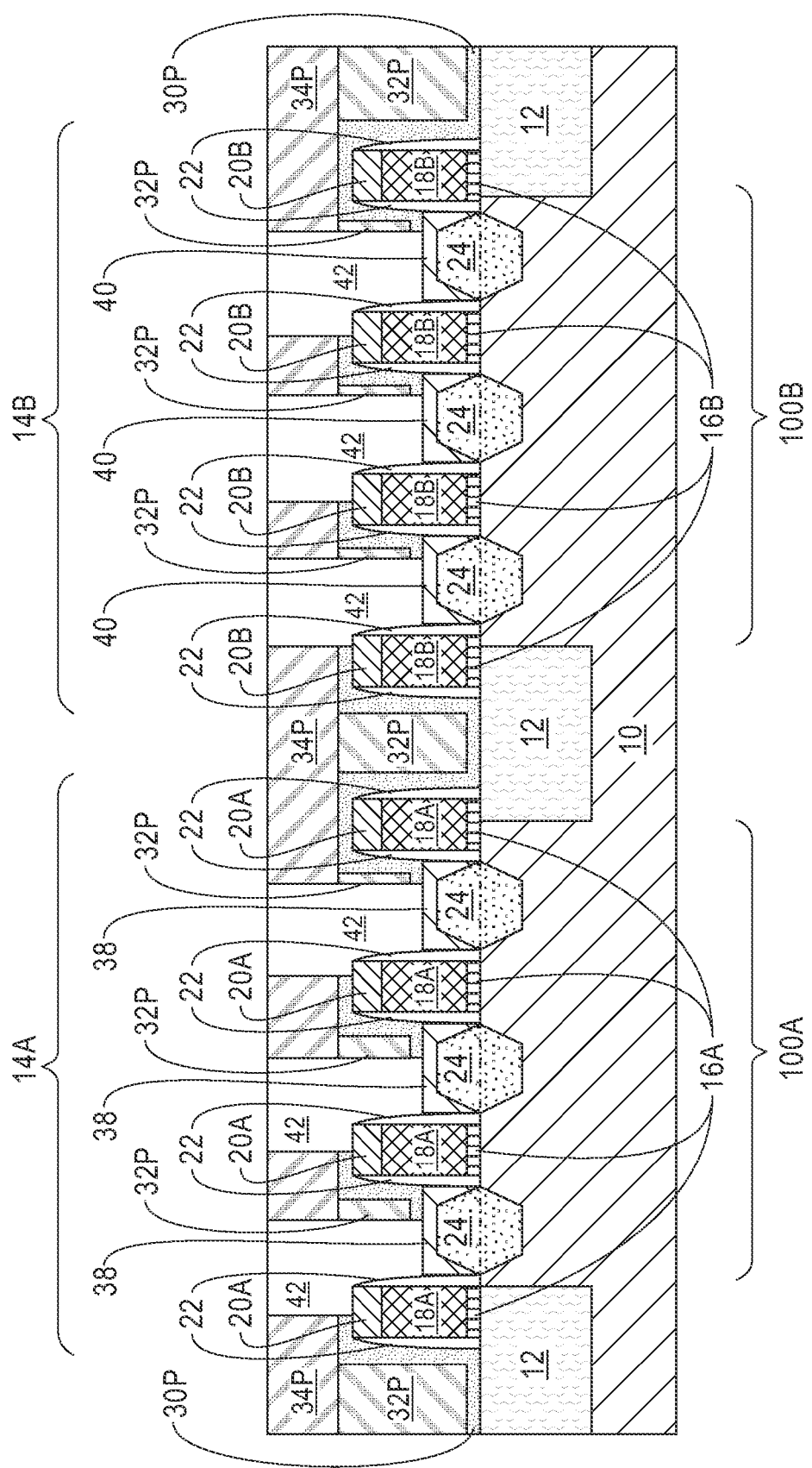
FIG. 12 is a cross sectional view of the exemplary semiconductor structure of FIG. 11 after providing a conductive metal structure within each contact opening.

Referring now to FIG. 12, there is illustrated the exemplary semiconductor structure of FIG. 11 after providing a conductive metal structure 42 within each contact opening 36. The conductive metal structure 42 that is provided in each contact opening 36 within the first device region 100A has a bottommost surface that directly contacts an exposed topmost surface of an underlying first metal semiconductor alloy contact 38. The conductive metal structure 42 that is provided in each contact opening 36 within the second device region 100B has a bottommost surface that directly contacts an exposed topmost surface of an underlying second metal semiconductor alloy contact 40. Each conductive metal structure 42 has a topmost surface that is coplanar with a topmost surface of each dielectric cap material portions 34P.

Each conductive metal structure 42 comprises a conductive metal such as, for example, copper, aluminum, tungsten, ruthenium, cobalt or alloys thereof. In some embodiments, each conductive metal structure 42 comprises a single conductive material. In yet other embodiments, each conductive metal structure may comprise at least two different conductive metals stacked one atop the other. The conductive metal that provides each conductive metal structure 42 can be formed by a deposition process such as, for example, chemical vapor deposition, plasma enhanced chemical vapor deposition, plating, or physical vapor deposition. Following the deposition process, the topmost conductive metal that provides the conductive metal structure 42 may be subjected to a planarization process such as, for example, chemical mechanical polishing and/or grinding.

In some embodiments, not show, a diffusion barrier material can be formed within each contact opening prior to forming the conductive metal that provides the conductive metal structure 42. When present, the diffusion barrier may include Co, CoN, Ir, Pt, Pd, Ta, TaN, Ti, TiN, Ru, RuN, RuTa, RuTaN, W or WN. The diffusion barrier may be formed utilizing any known deposition process including, for example, chemical vapor deposition or plasma enhanced chemical vapor deposition. When present, the diffusion barrier can have a thickness 1 nm to 50 nm. Other thicknesses that are lesser than, or greater than, the aforementioned thickness range may also be employed for the optional diffusion barrier.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
    forming a gate stack in a device region of a semiconductor substrate, wherein a source/drain structure is provided at least within a portion of said semiconductor substrate and at a footprint of said gate stack;
    forming a sacrificial layer on an exposed surface of each of said source/drain structures;
    providing a material stack of, from bottom to top, a middle-of-the-line (MOL) liner and a MOL dielectric material surrounding said gate stack;
    forming a contact opening through a portion of said material stack to expose a portion of said sacrificial layer present on said exposed surface of each of said source/drain structures; and
    replacing an entirety of said sacrificial layer with a metal semiconductor alloy contact, wherein said metal semiconductor alloy contact is present on said exposed surface of each of said source/drain structures.

2. The method of claim 1, wherein said gate stack is a functional gate stack comprising a gate dielectric material portion and a gate conductor portion.

3. The method of claim 1, wherein said gate stack is a sacrificial gate stack, and wherein said sacrificial gate stack is replaced with a functional gate stack after said MOL dielectric material is provided.

4. The method of claim 1, wherein said forming said sacrificial layer comprises a selective deposition process.

5. The method of claim 4, wherein said sacrificial layer comprises germanium, a semiconductor oxide, AlAs or GaP.

6. The method of claim 1, wherein said MOL liner over said gate stack has a topmost surface that is coplanar with a topmost surface of said MOL dielectric material.

7. The method of claim 1, wherein said forming said contact opening comprises lithography and etching.

8. The method of claim 7, wherein said etching comprises an etch that removes portions of said MOL dielectric material, stopping on a portion of said MOL liner, and another etch to remove said exposed portion of said MOL liner.

9. The method of claim 1, wherein said source/drain structures comprises source/drain diffusion regions.

10. The method of claim 9, wherein said source/drain structures further comprise a raised source/drain region located on each of said source/drain diffusion regions.

11. The method of claim 1, further comprising forming a conductive metal structure atop said metal semiconductor alloy contact and within each contact opening.

12. A method of forming a semiconductor structure, said method comprising:
    forming a first gate stack in a first device region and a second gate stack in a second device region of a semiconductor substrate, wherein a source/drain structure is provided at least within a portion of said semiconductor substrate and at a footprint of said first gate stack and said second gate stack;
    forming a sacrificial layer on an exposed surface of each of said source/drain structures;
    providing a material stack of, from bottom to top, a middle-of-the-line (MOL) liner and a MOL dielectric material surrounding said first gate stack and said second gate stack;
    forming a contact opening through a portion of said material stack to expose a portion of said sacrificial layer present on said exposed surface of each of said source/drain structures;
    replacing an entirety of said sacrificial layer within said first device region with a first metal semiconductor alloy contact, wherein said first metal semiconductor alloy contact is present on said exposed surface of each of said source/drain structures within said first device region; and
    replacing an entirety of said sacrificial layer within said second device region with a second metal semiconductor alloy contact, wherein said second metal semiconductor alloy contact is present on said exposed surface of each of said source/drain structures within said second device region, and wherein said replacing of said entirety of said sacrificial layer within said first device region with said first semiconductor alloy contact, and said replacing of said entirety of said sacrificial layer within said second device region are performed simultaneously or one after the other.

13. The method of claim 12, wherein said first gate stack and said second gate stacks are both functional gate stacks comprising a gate dielectric material portion and a gate conductor portion.

14. The method of claim 12, wherein said first gate stack and said second gate stack are both sacrificial gate stacks, and wherein said sacrificial gate stacks are replaced with a functional gate stack after said MOL dielectric material is provided.

15. The method of claim 12, wherein said forming said sacrificial layer comprises a selective deposition process.

16. The method of claim 15, wherein said sacrificial layer comprises germanium, a semiconductor oxide, AlAs or GaP.

17. The method of claim 12, wherein said MOL liner over said first and second gate stacks has a topmost surface that is coplanar with a topmost surface of said MOL dielectric material.

18. The method of claim 12, wherein said forming said contact opening comprises lithography and etching.

19. The method of claim 18, wherein said etching comprises an etch that removes portions of said MOL dielectric material, stopping on a portion of said MOL liner, and another etch to remove said exposed portion of said MOL liner.

20. The method of claim 12, further comprising forming a conductive metal structure atop said first metal semiconductor alloy contact and second metal semiconductor alloy contact and within each contact opening.

\* \* \* \* \*